(12) United States Patent
Atnip et al.

(10) Patent No.: US 9,446,947 B2
(45) Date of Patent: Sep. 20, 2016

(54) USE OF METAL NATIVE OXIDE TO CONTROL STRESS GRADIENT AND BENDING MOMENT OF A RELEASED MEMS STRUCTURE

(71) Applicant: TEXAS INSTRUMENTS INCORPORATED, Dallas, TX (US)

(72) Inventors: Earl Vedere Atnip, Plano, TX (US); Raul Enrique Barreto, Austin, TX (US); Kelly J. Taylor, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/467,521

(22) Filed: Aug. 25, 2014

(65) Prior Publication Data

US 2016/0052778 A1 Feb. 25, 2016

(51) Int. Cl.
*B81C 1/00* (2006.01)

(52) U.S. Cl.
CPC .... *B81C 1/00365* (2013.01); *B81B 2203/0109* (2013.01); *B81B 2203/0118* (2013.01)

(58) Field of Classification Search
CPC .............................. H01L 21/60; B81C 1/0015
See application file for complete search history.

(56) References Cited

U.S. PATENT DOCUMENTS

| | | | |
|---|---|---|---|
| 6,509,622 B1 * | 1/2003 | Ma et al. | 257/483 |
| 6,706,202 B1 | 3/2004 | Sun et al. | |
| 7,404,909 B2 | 7/2008 | Rothenbury | |
| 7,430,072 B2 | 9/2008 | Roth et al. | |
| 8,259,382 B2 | 9/2012 | Mehrl | |
| 8,526,096 B2 * | 9/2013 | Steyn et al. | 359/290 |
| 9,120,667 B2 * | 9/2015 | Jahnes et al. | |
| 2003/0036215 A1 * | 2/2003 | Reid | 438/52 |
| 2003/0224559 A1 * | 12/2003 | Gross | 438/128 |
| 2004/0100677 A1 * | 5/2004 | Huibers et al. | 359/290 |
| 2005/0074919 A1 * | 4/2005 | Patel et al. | 438/107 |
| 2005/0227054 A1 | 10/2005 | Parthum | |
| 2006/0125503 A1 * | 6/2006 | Leung | 324/762 |
| 2006/0181379 A1 * | 8/2006 | Schwartz et al. | 335/78 |
| 2008/0138922 A1 * | 6/2008 | Wan | 438/52 |
| 2009/0101622 A1 * | 4/2009 | Wang et al. | 216/13 |
| 2009/0134513 A1 * | 5/2009 | Qiu | 257/734 |
| 2009/0215213 A1 * | 8/2009 | Chou | 438/48 |
| 2010/0065931 A1 * | 3/2010 | Shih | 257/416 |
| 2010/0301430 A1 * | 12/2010 | Huang | 257/415 |
| 2011/0042204 A1 * | 2/2011 | Chiang et al. | 204/242 |

(Continued)

OTHER PUBLICATIONS

W.S. Yang, et al., "Deformation reduction of a MEMS sensor by stress balancing of multilayer", The Second International Conference on Sensor Technologies.

(Continued)

*Primary Examiner* — Mohammad Islam
*Assistant Examiner* — Ankush Singal
(74) *Attorney, Agent, or Firm* — Michael A. Davis, Jr.; Frank D. Cimino

(57) ABSTRACT

A MEMS device is formed by forming a sacrificial layer over a substrate and forming a first metal layer over the sacrificial layer. Subsequently, the first metal layer is exposed to an oxidizing ambient which oxidizes a surface layer of the first metal layer where exposed to the oxidizing ambient, to form a native oxide layer of the first metal layer. A second metal layer is subsequently formed over the native oxide layer of the first metal layer. The sacrificial layer is subsequently removed, forming a released metal structure.

14 Claims, 17 Drawing Sheets

(56) References Cited

U.S. PATENT DOCUMENTS

2011/0111545 A1* 5/2011 El-Gamal ................. 438/50
2014/0264474 A1* 9/2014 Chu et al. ................. 257/254

OTHER PUBLICATIONS

W.J. Arora, et al., "Membrane folding by ion implantation induced stress to fabricate three-dimensional nanostructures", Microelectronic Engineering 84 (2007).

* cited by examiner

USE OF METAL NATIVE OXIDE TO CONTROL STRESS GRADIENT AND BENDING MOMENT OF A RELEASED MEMS STRUCTURE

FIELD OF THE INVENTION

This invention relates to the field of microelectronic-mechanical systems (MEMS) devices. More particularly, this invention relates to metal structures in MEMS devices.

BACKGROUND OF THE INVENTION

A MEMS device may contain a released metal structure which is formed by depositing one or more metal layers over a sacrificial layer and subsequently removing the sacrificial layer. Attaining a desired shape of the released metal structure may be problematic, possibly due to internal stresses in the metal layers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A MEMS device is formed by forming a sacrificial layer over a substrate and forming a first metal layer over the sacrificial layer. Subsequently, the first metal layer is exposed to an oxidizing ambient which oxidizes a surface layer of the first metal layer where exposed to the oxidizing ambient, to form a native oxide layer of the first metal layer. A second metal layer is subsequently formed over the native oxide layer of the first metal layer. The sacrificial layer is subsequently removed, forming a released metal structure.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A MEMS device is formed by forming a sacrificial layer over a substrate and forming a first metal layer over the sacrificial layer. Subsequently, the first metal layer is exposed to an oxidizing ambient which oxidizes a surface layer of the first metal layer where exposed to the oxidizing ambient, to form a native oxide layer of the first metal layer. A second metal layer is subsequently formed over the native oxide layer of the first metal layer. The sacrificial layer is subsequently removed, forming a released metal structure in which a portion of the released metal structure is free of any direct contact with solid elements of the MEMS device.

The native oxide layer may be contiguous with a native oxide layer at a bottom surface of the released metal structure, or may be contiguous with a native oxide layer at a top surface of the released metal structure, or may be located between metal layers in the released metal structure. More than one native oxide layer may be formed in the released metal structure.

For the purposes of this disclosure, the term native oxide layer of a metal layer is understood to mean an oxide of the metal in the metal layer, formed by oxidation of metal atoms at a surface of the metal layer. It is further understood that the term native oxide layer precludes metal oxides formed by anodization, deposition of additional metal in an oxidizing ambient, ion implantation of oxidizing species, or immersion in a liquid oxidizing solution.

Figure 1A:
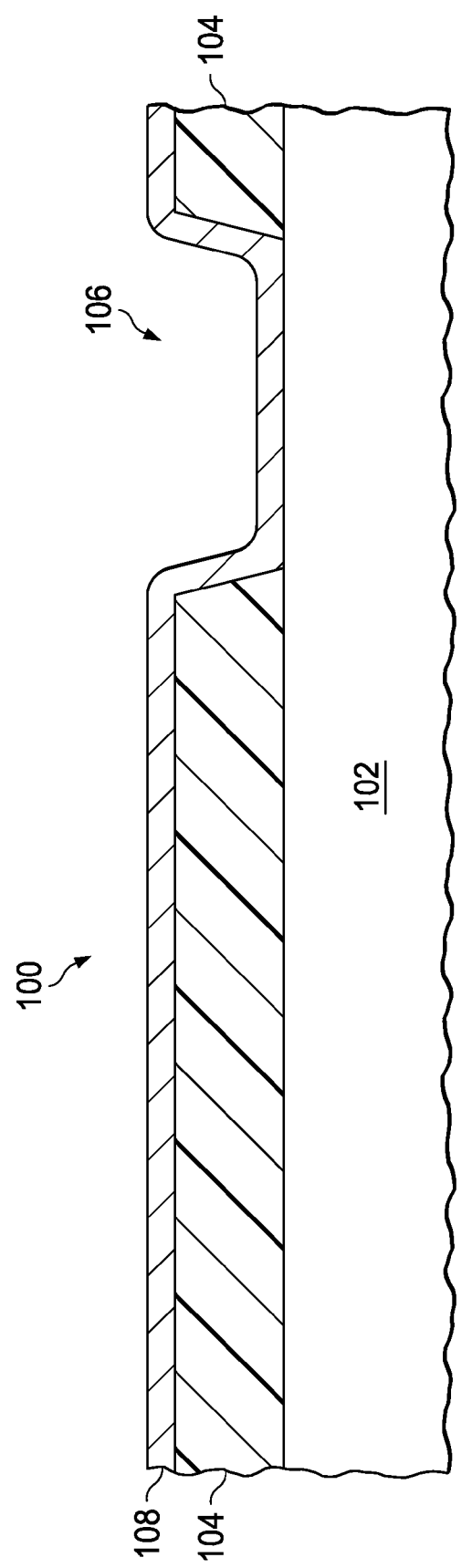
FIG. 1A through FIG. 1G are cross sections of an exemplary MEMS device containing a released metal structure, depicted in successive stages of fabrication.

FIG. 1A through FIG. 1G are cross sections of an exemplary MEMS device containing a released metal structure, depicted in successive stages of fabrication. Referring to FIG. 1A, the MEMS device 100 is formed on a substrate 102. The substrate 102 may be, for example, a silicon wafer, a glass or sapphire panel, a ceramic substrate, a multilayer substrate, or other substrate suitable for forming the MEMS device 100. Furthermore, the substrate 102 may include elements of the MEMS device 100 formed prior to the instant stage of fabrication.

A sacrificial layer 104 is formed over the substrate 102. The sacrificial layer 104 may optionally be patterned so that a via hole 106 is formed through the sacrificial layer 104. The sacrificial layer 104 may include a photoactive polymer such as polyimide or photoresist, and the via hole 106 if present may be formed by a photolithographic process. Alternatively, the sacrificial layer 104 may include a non-photoactive polymer such as novolak resin or methyl methacrylate, and the via hole 106 if present may be formed by a mask and etch process. In a further version of the instant example, the sacrificial layer 104 may include inorganic dielectric material such as low-k dielectric material or porous material. Instances of the sacrificial layer 104 containing other materials are within the scope of the instant example.

A first metal layer 108 of the released metal structure is formed over the sacrificial layer 104. The first metal layer 108 may be, for instance, 10 nanometers to 60 nanometers of titanium aluminum alloy formed by physical vapor deposition (PVD), or may be 50 nanometers to 100 nanometers of sputtered aluminum with 0.1 to 3 percent silicon, copper and/or titanium, or may be 120 nanometers to 500 nanometers of titanium aluminum alloy formed by PVD. Instances of the first metal layer 108 containing other metals are within the scope of the instant example. The first metal layer 108 may extend conformally into the via hole 106 if present.

Figure 1B:
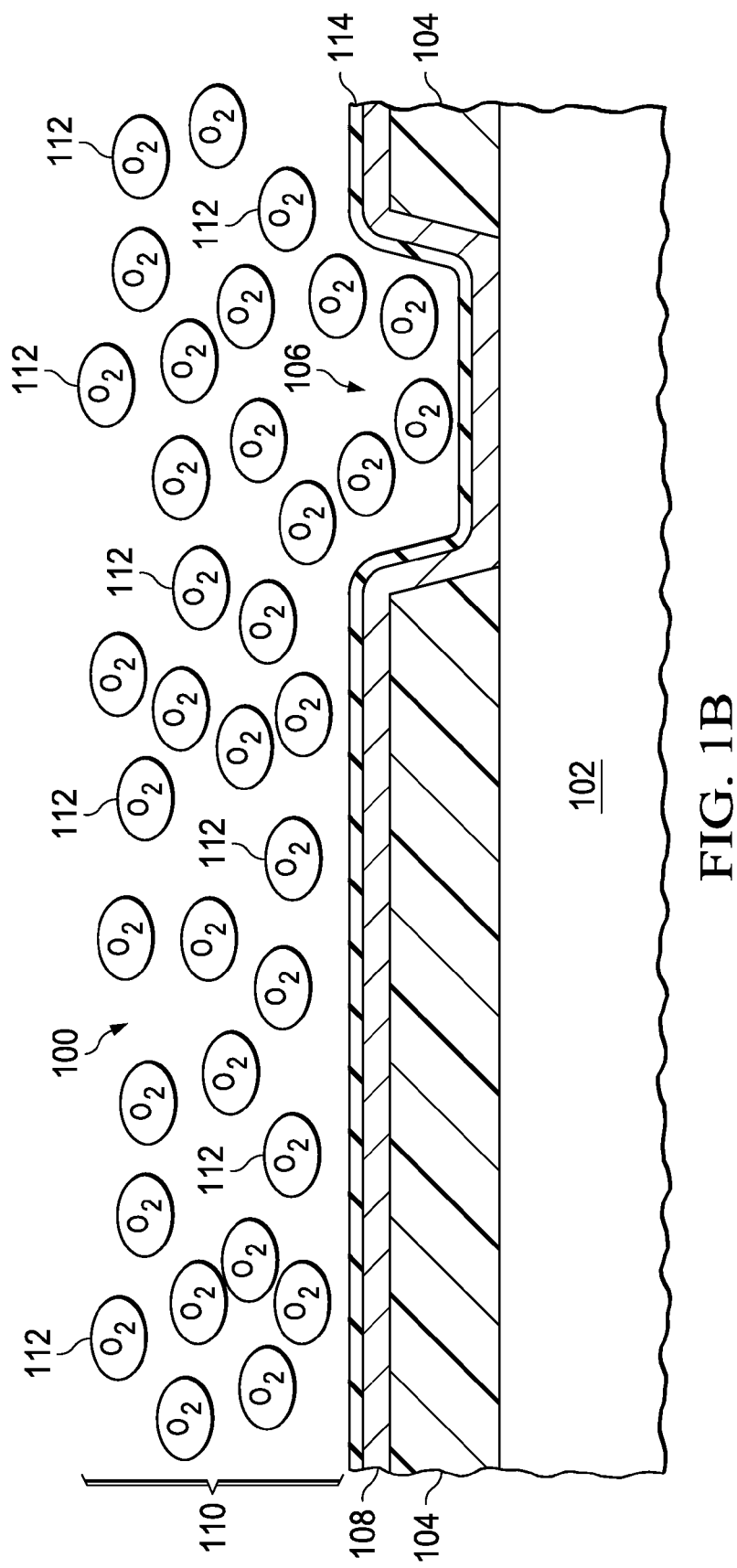

Referring to FIG. 1B, the first metal layer 108 is exposed to a first oxidizing ambient 110. The first oxidizing ambient 110 may be ordinary air at 20° C. to 25° C. and atmospheric pressure, so that an oxidizing species of the first oxidizing ambient 110 is predominantly oxygen molecules 112, as depicted schematically in FIG. 1B. Alternatively, the first oxidizing ambient 110 may be, for example, oxygen gas at less than atmospheric pressure, ozone or an oxygen containing plasma, so that the oxidizing species may include oxygen ions, ozone, or oxygen radicals. The first metal layer 108 may be exposed to the first oxidizing ambient 110 by removing the MEMS device 100 from a process tool in which the first metal layer 108 was formed, or the first oxidizing ambient 110 may be introduced into the process tool after the first metal layer 108 is formed.

Exposure to the first oxidizing ambient 110 forms a first native oxide layer 114 at a top surface of the first metal layer 108, the top surface being the surface of the first metal layer 108 exposed to the first oxidizing ambient 110, regardless of the orientation of the MEMS device 100 during exposure to the first oxidizing ambient 110. The first native oxide layer 114 may be, for example, 1 nanometer to 10 nanometers thick, depending on a composition of the first metal layer 108. In one version of the instant example, the first metal layer 108 is exposed to the first oxidizing ambient 110 for a sufficient time so that formation of the first native oxide layer 114 is substantially self-limiting, that is, a thickness of the first native oxide layer 114 remains substantially constant with prolonged exposure to the first oxidizing ambient 110.

Figure 1C:
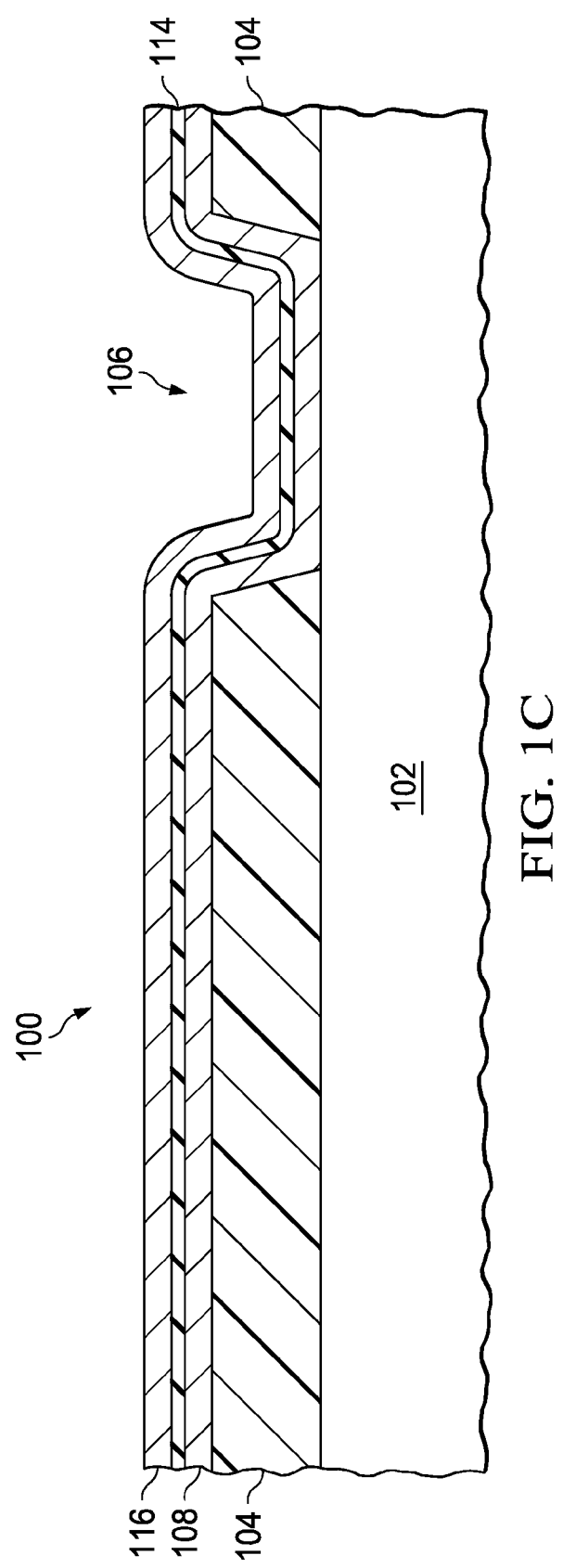

Referring to FIG. 1C, a second metal layer 116 is formed over the first native oxide layer 114. In one version of the instant example, the second metal level 116 may have a same composition as the first metal level 108. In another version, the second metal level 116 may have a different composition from the first metal level 108. In the version in which the first metal level 108 is 10 nanometers to 60 nanometers of titanium aluminum alloy, the second metal layer 116 may be 30 nanometers to 80 nanometers of titanium aluminum alloy also formed by PVD. In the version in which the first metal level 108 is 50 nanometers to 100 nanometers of sputtered aluminum, the second metal layer 116 may be 100 nanometers to 150 nanometers of sputtered aluminum. In the version in which the first metal level 108 is 200 nanometers to 500 nanometers of titanium aluminum alloy, the second metal layer 116 may be 300 nanometers to 500 nanometers of titanium aluminum alloy also formed by PVD. Instances of the second metal layer 116 containing other metals are within the scope of the instant example. The second metal layer 116 may extend conformally into the via hole 106 if present.

Figure 1D:
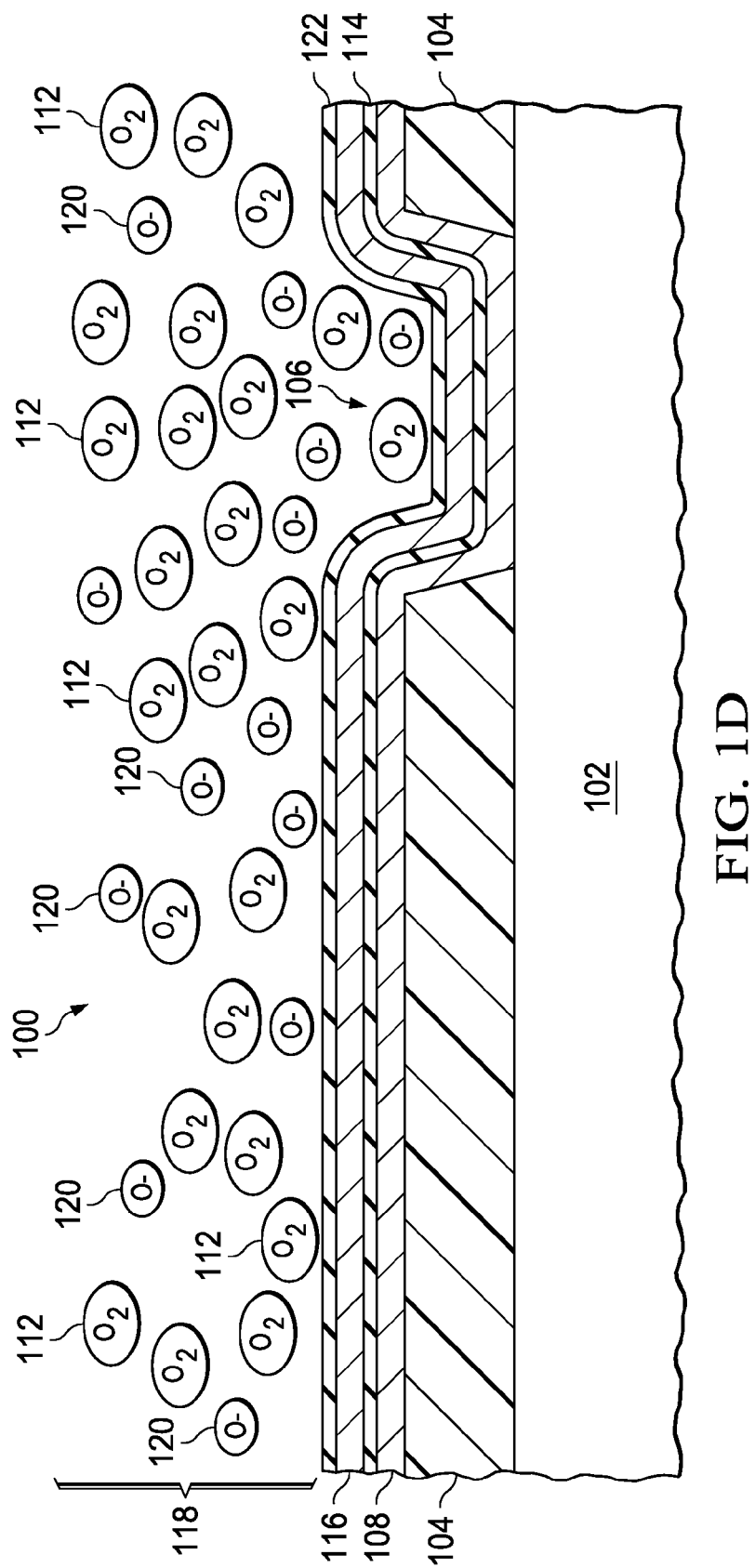

Referring to FIG. 1D, the second metal layer 116 may optionally be exposed to a second oxidizing ambient 118. The second oxidizing ambient 118 may be, for example, an oxygen containing plasma, so that an oxidizing species includes oxygen molecules 112 and oxygen radicals 120, as depicted in FIG. 1D. Alternatively, the second oxidizing ambient 118 may be, for example, ordinary air, ozone or an oxygen containing plasma. The second metal layer 116 may be exposed to the second oxidizing ambient 118 by various methods, as described in respect to FIG. 1B.

Exposure to the second oxidizing ambient 118 forms a second native oxide layer 122 at a top surface of the second metal layer 116, the top surface being the surface of the second metal layer 116 exposed to the second oxidizing ambient 118, regardless of the orientation of the MEMS device 100 during exposure to the second oxidizing ambient 118. The second native oxide layer 122 may be, for example, 1 nanometer to 10 nanometers thick, depending on a composition of the second metal layer 116. In one version of the instant example, the second metal layer 116 is exposed to the second oxidizing ambient 118 for a sufficient time so that formation of the second native oxide layer 122 is substantially self-limiting.

Figure 1E:
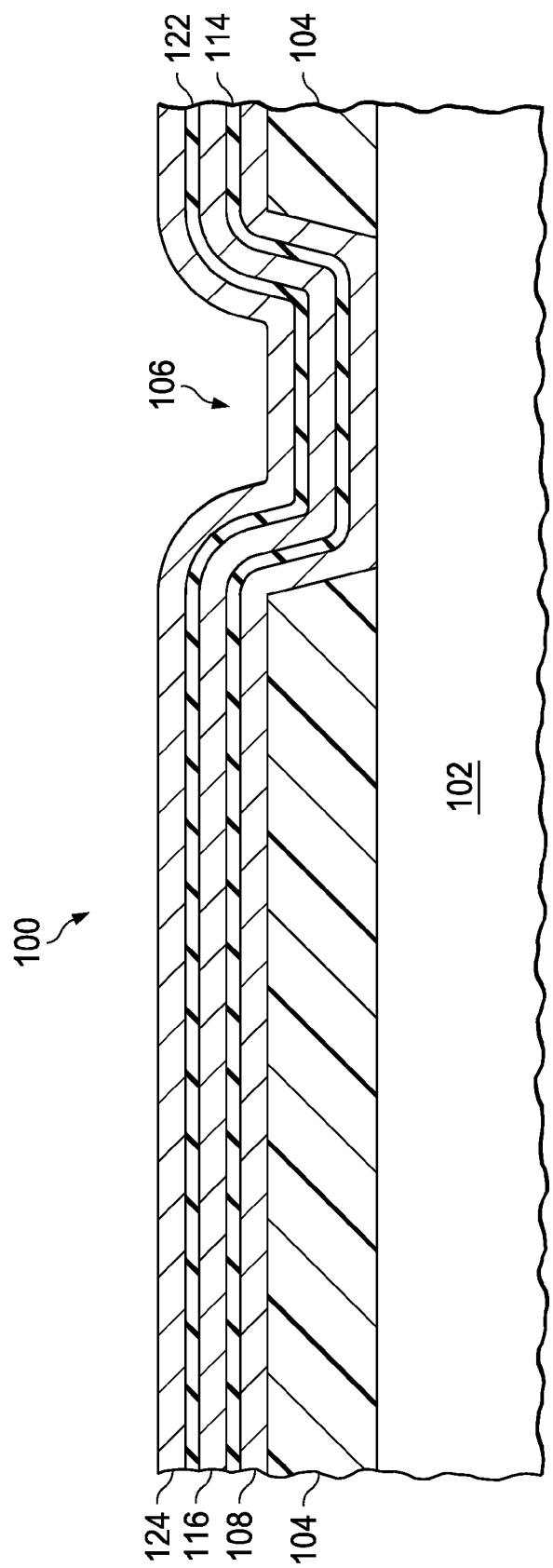

Referring to FIG. 1E, a third metal layer 124 may optionally be formed over the second native oxide layer 122. In one version of the instant example, the third metal layer 124 may have a same composition as the first metal level 108 or the second metal level 116. In another version, the third metal layer 124 may have a different composition from the first metal level 108 and the second metal level 116. The third metal layer 124 may extend conformally into the via hole 106 if present.

Figure 1F:
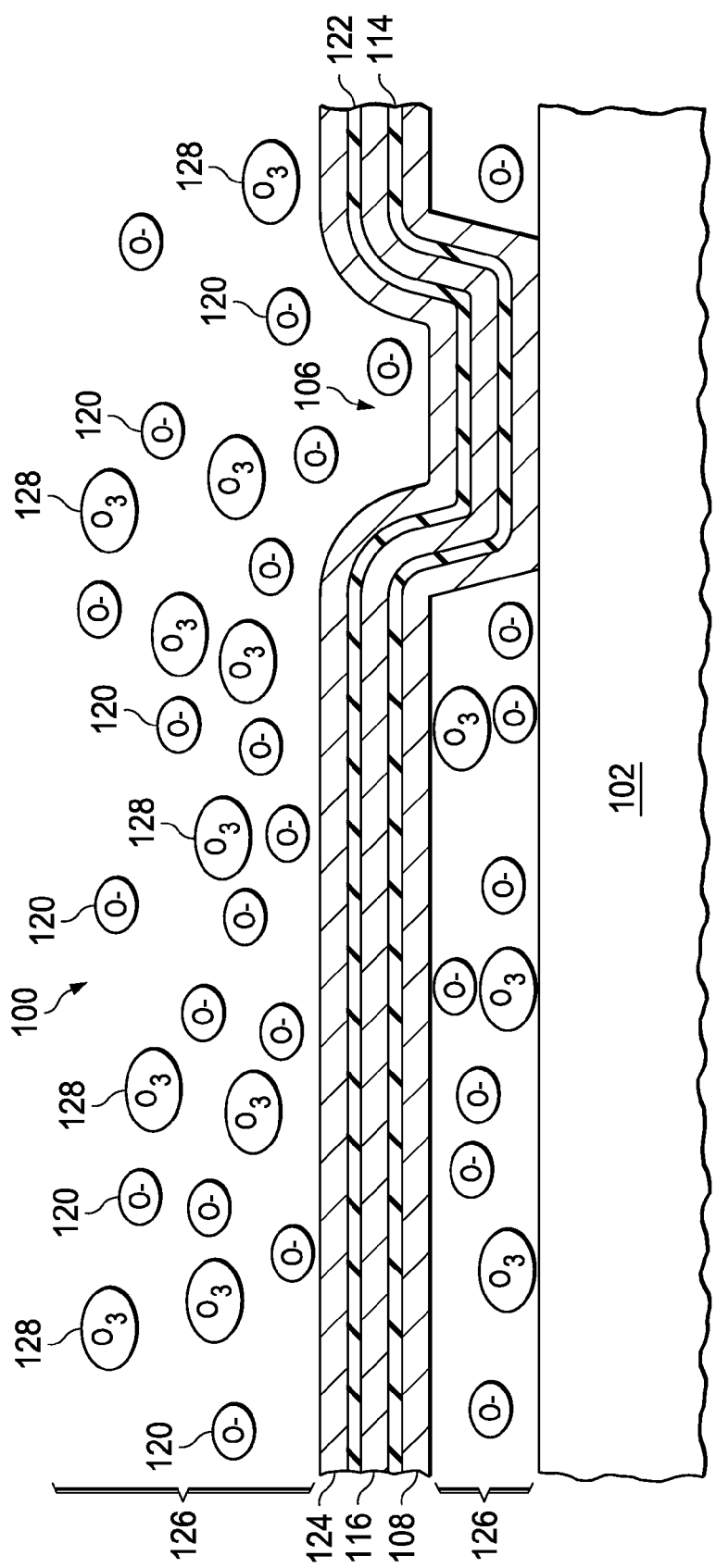

Referring to FIG. 1F, a release process is performed on the MEMS device 100 which removes the sacrificial layer 104 of FIG. 1E. The release process may include, for example, exposing the MEMS device 100 to an ashing ambient 126 containing oxygen radicals 120 and/or ozone 128, using a downstream asher. The release process may possibly oxidize a bottom surface of the first metal layer 108 and/or a top surface of the third metal layer 124.

Figure 1G:
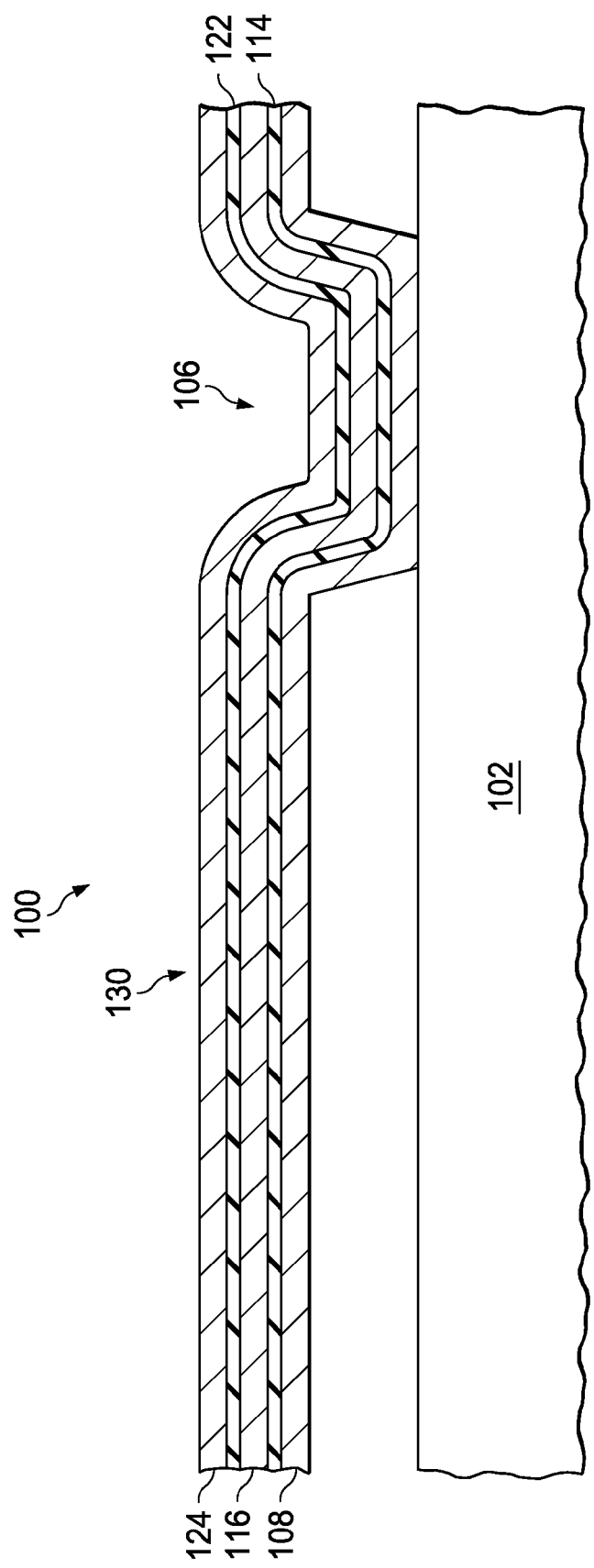

FIG. 1G depicts the MEMS device 100 after the release process is completed. The first metal layer 108, the first native oxide layer 114, the second metal layer 116, the second native oxide layer 122 if present, and the third metal layer 124 if present provide the released metal structure 130 of the MEMS device 100. A portion of the released metal structure 130 is free of any direct contact with solid elements of the MEMS device 100. In the instant example, the portion of the released metal structure 130 which is free of any contact with solid elements of the MEMS device 100 has a substantially flat shape; the substantially flat shape is provided by a balance of compressive stress in the first native oxide layer 114 and the second native oxide layer 122 if present, with a cumulative tensile stress in the first metal layer 108, the second metal layer 116 and the third metal layer 124 if present. The released metal structure 130 may be attached to the substrate 102 through the via hole 106 if present. If the via hole 106 is not present, the released metal structure 130 is attached to the substrate 102, possibly through other elements, not shown of the MEMS device 100.

Forming the native oxide layers 114 and 122 provides more process latitude compared to other methods of forming metal oxides, as thicknesses of the native oxide layers 114 and 122 are substantially self-limiting during exposure to oxidizing ambients. Also, stress levels of the native oxide layers 114 and 122 tend to be more reproducible compared to metal oxides formed by other methods. Thus, forming the released metal structure 130 to include the first native oxide layer 114 and the second native oxide layer 122 may advantageously reduce fabrication cost and complexity of the MEMS device 100.

Figure 2A:
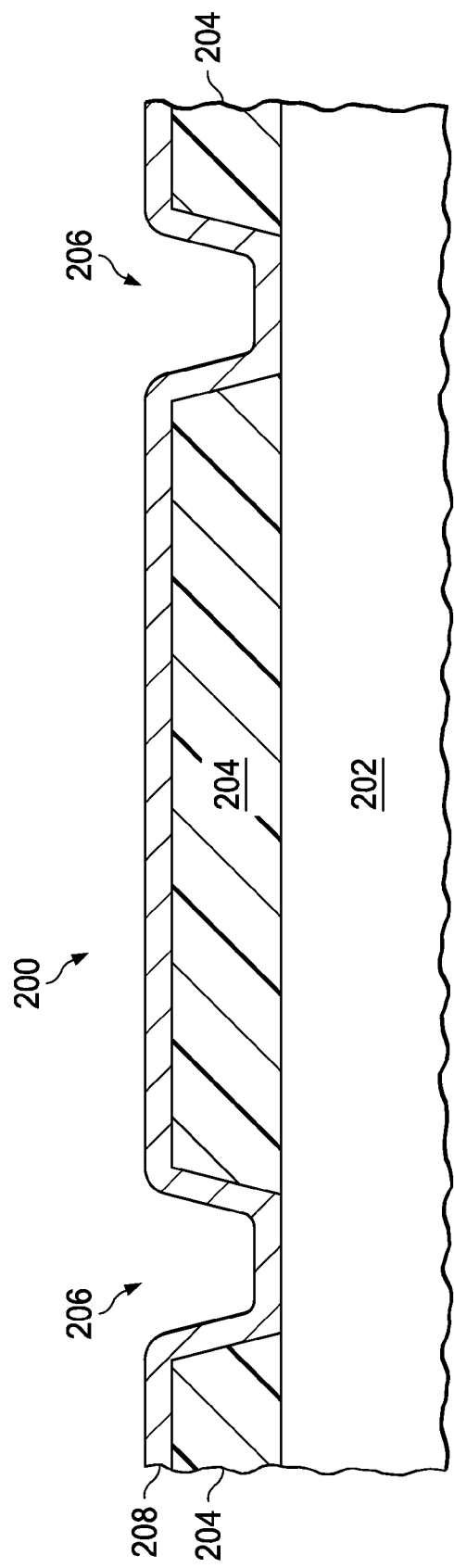
FIG. 2A through FIG. 2F are cross sections of another exemplary MEMS device containing a released metal structure, depicted in successive stages of fabrication.

FIG. 2A through FIG. 2F are cross sections of another exemplary MEMS device containing a released metal structure, depicted in successive stages of fabrication. Referring to FIG. 2A, the MEMS device 200 is formed on a substrate 202, for example, similar to the substrate 102 described in reference to FIG. 1A.

A sacrificial layer 204 is formed over the substrate 202. The sacrificial layer 204 may optionally be patterned so that via holes 206 are formed through the sacrificial layer 204.

The sacrificial layer 204 may include materials and be patterned as described in reference to FIG. 1A.

A first metal layer 208 of the released metal structure is formed over the sacrificial layer 204. The first metal layer 208 may include aluminum, titanium, tungsten, and/or other metals. In the instant example, the first metal layer 208 is at least 20 nanometers thick. The first metal layer 208 may extend conformally into the via holes 206 if present.

Figure 2B:
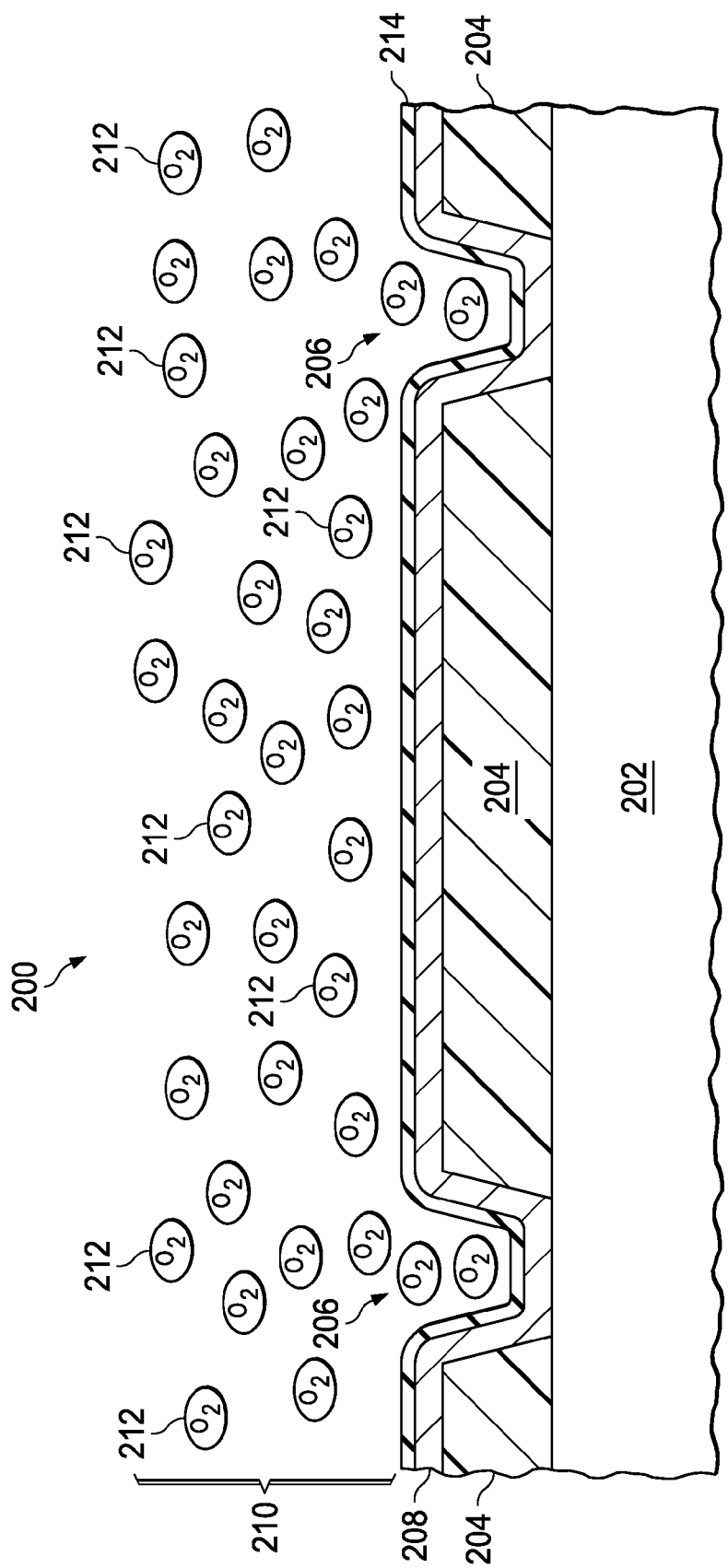

Referring to FIG. 2B, the first metal layer 208 is exposed to a first oxidizing ambient 210. The first oxidizing ambient 210 may be for example, ordinary air, oxygen gas at less than atmospheric pressure, ozone or an oxygen containing plasma. An oxidizing species of the first oxidizing ambient 210 may be, for example, predominantly oxygen molecules 212, as depicted schematically in FIG. 2B, or may include oxygen ions, ozone, or oxygen radicals. As described in reference to FIG. 2B, the first metal layer 208 may be exposed to the first oxidizing ambient 210 by removing the MEMS device 200 from a process tool in which the first metal layer 208 was formed, or the first oxidizing ambient 210 may be introduced into the process tool after the first metal layer 208 is formed.

Exposure to the first oxidizing ambient 210 forms a first native oxide layer 214 at a top surface of the first metal layer 208, the top surface being the surface of the first metal layer 208 exposed to the first oxidizing ambient 210, regardless of the orientation of the MEMS device 200 during exposure to the first oxidizing ambient 210. The first native oxide layer 214 may be, for example, 1 nanometer to 10 nanometers thick, depending on a composition of the first metal layer 208. In one version of the instant example, the first metal layer 208 is exposed to the first oxidizing ambient 210 for a sufficient time so that formation of the first native oxide layer 214 is substantially self-limiting.

Figure 2C:
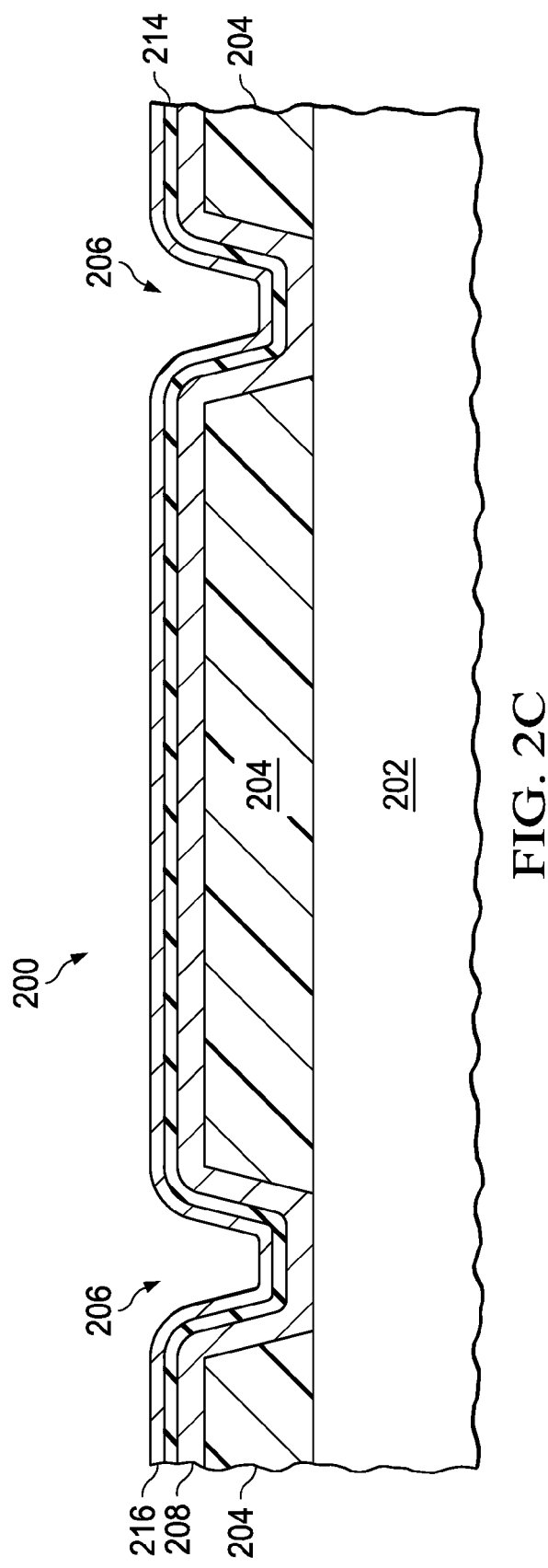

Referring to FIG. 2C, a second metal layer 216 is formed over the first native oxide layer 214. In the instant example, a thickness of the second metal layer 216 is such that substantially all of the second metal layer 216 will be converted to metal oxide during subsequent exposure to a second oxidizing ambient. The thickness of the second metal layer 216 may therefore be, for example, 1 nanometer to 5 nanometers, depending on the metals in the second metal layer 216. In one version of the instant example, the second metal level 216 may have a same composition as the first metal level 208. In another version, the second metal level 216 may have a different composition from the first metal level 208. The second metal layer 216 may extend conformally into the via holes 206 if present.

Figure 2D:
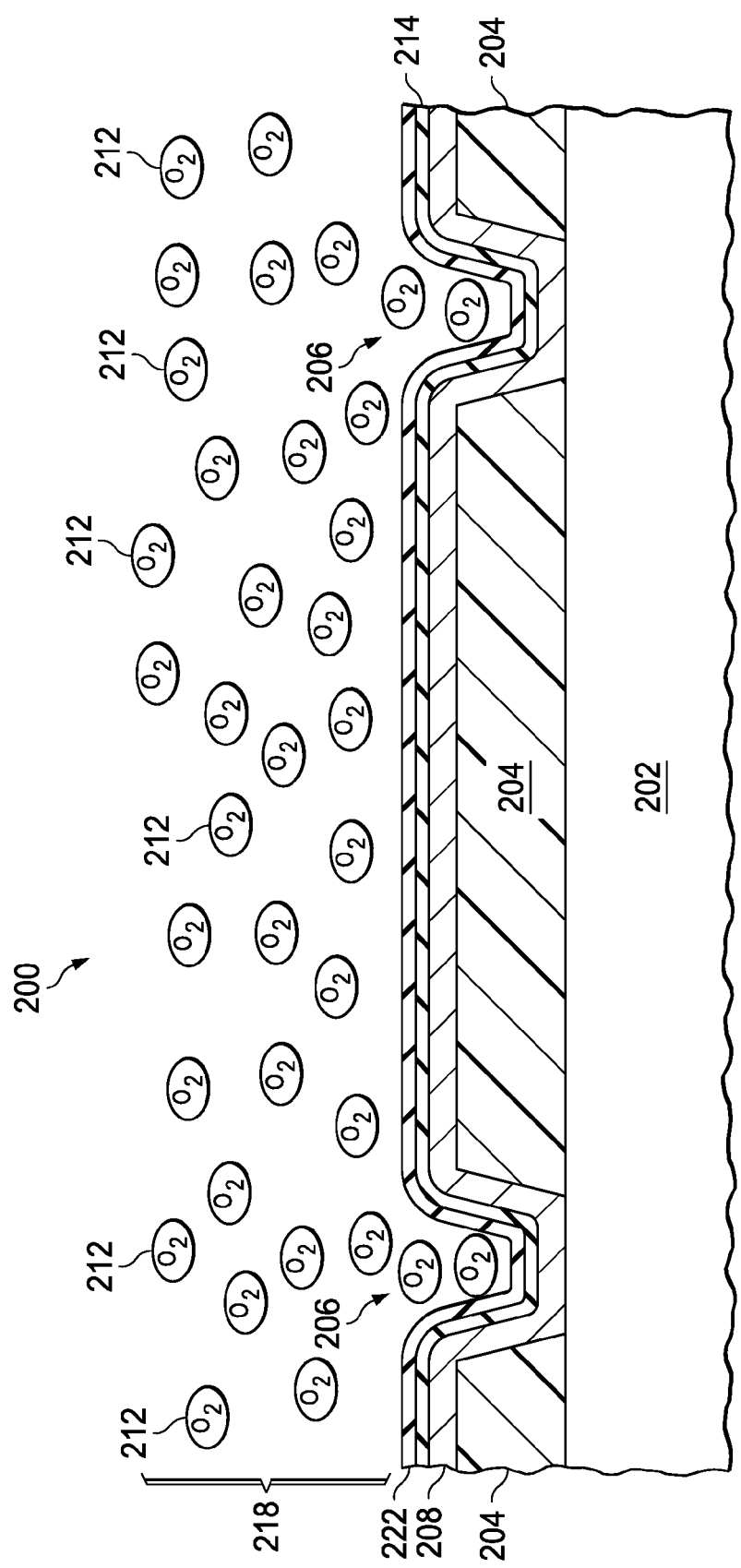

Referring to FIG. 2D, the second metal layer 216 is exposed to a second oxidizing ambient 218. The second oxidizing ambient 218 may include oxygen molecules 212 as depicted schematically in FIG. 2D, and/or may include other oxidizing species such as ozone and oxygen radicals. The second metal layer 216 may be exposed to the second oxidizing ambient 218 by various methods, as described in respect to FIG. 1B.

Exposure to the second oxidizing ambient 218 forms a second native oxide layer 222 which consumes substantially all of the second metal layer 216 of FIG. 2C. In the instant example, the second native oxide layer 222 contacts the first native oxide layer 214.

Figure 2E:
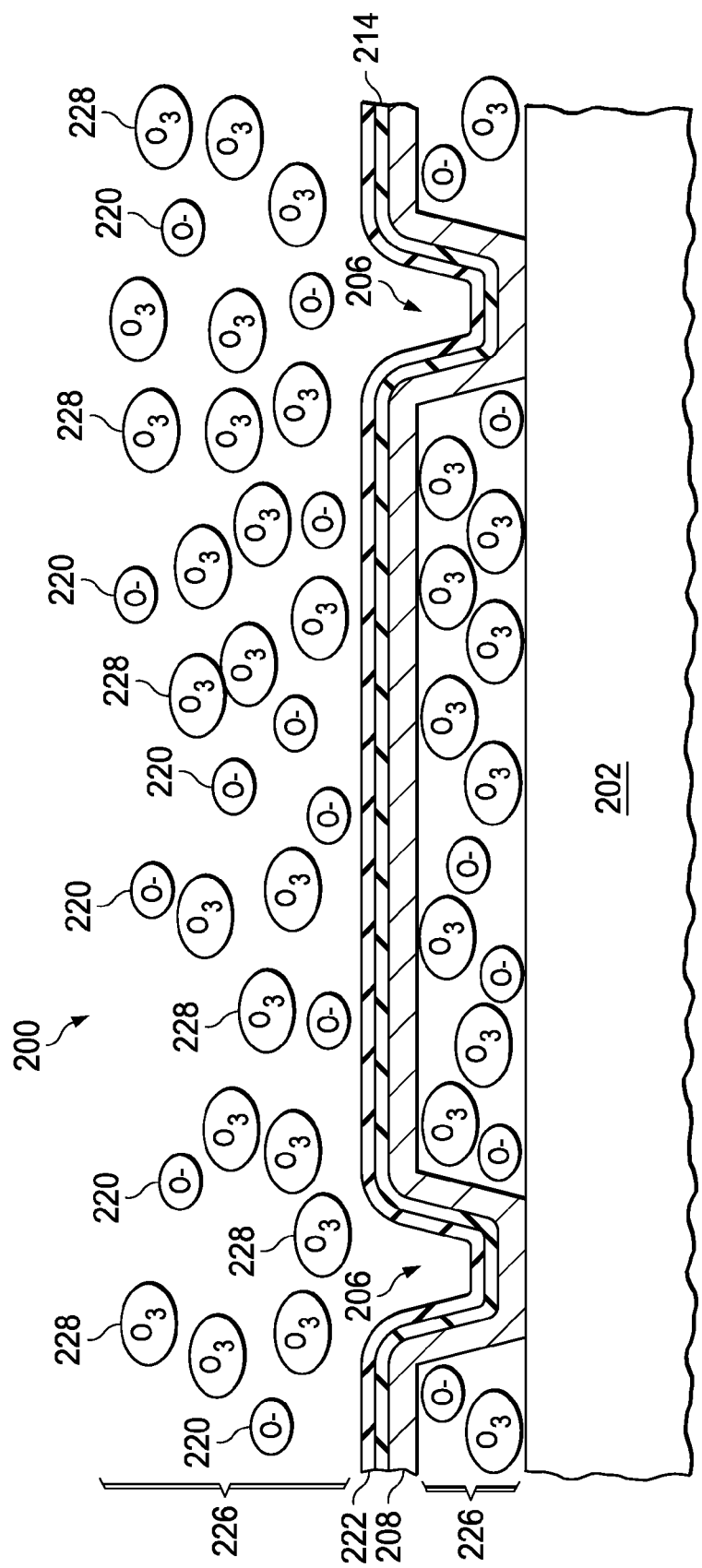

Referring to FIG. 2E, a release process is performed on the MEMS device 200 which removes the sacrificial layer 204 of FIG. 2D. The release process may include ozone molecules 228 and oxygen radicals 220 and may be performed as described in reference to FIG. 1F. The release process may possibly oxidize a bottom surface of the first metal layer 208.

Figure 2F:
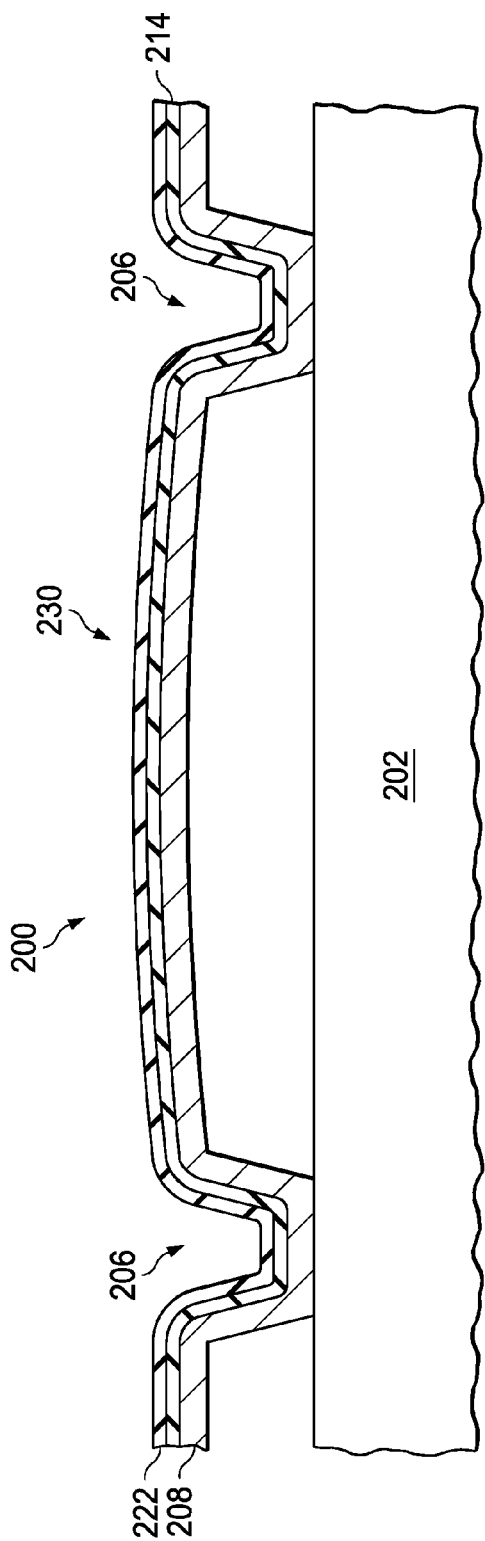

FIG. 2F depicts the MEMS device 200 after the release process is completed. The first metal layer 208, the first native oxide layer 214 and the second native oxide layer 222 provide the released metal structure 230 of the MEMS device 200. A portion of the released metal structure 230 is free of any direct contact with solid elements of the MEMS device 200. The second native oxide layer 222 is free of direct contact with any metal layer in the portion of the released metal structure 230 which is free of any contact with solid elements of the MEMS device 200. In the instant example, the portion of the released metal structure 230 which is free of any contact with solid elements of the MEMS device 200 has a desired convex shape, which is provided by a greater magnitude of compressive stress in the first native oxide layer 214 and the second native oxide layer 222, than a stress in the first metal layer 208. The convex shape of the released metal structure 230 may provide an optical element or sensor element of the MEMS device 200. The released metal structure 230 may be attached to the substrate 202 through the via hole 206 if present. If the via hole 206 is not present, the released metal structure 230 is attached to the substrate 202, possibly through other elements, not shown of the MEMS device 200.

Figure 3A:
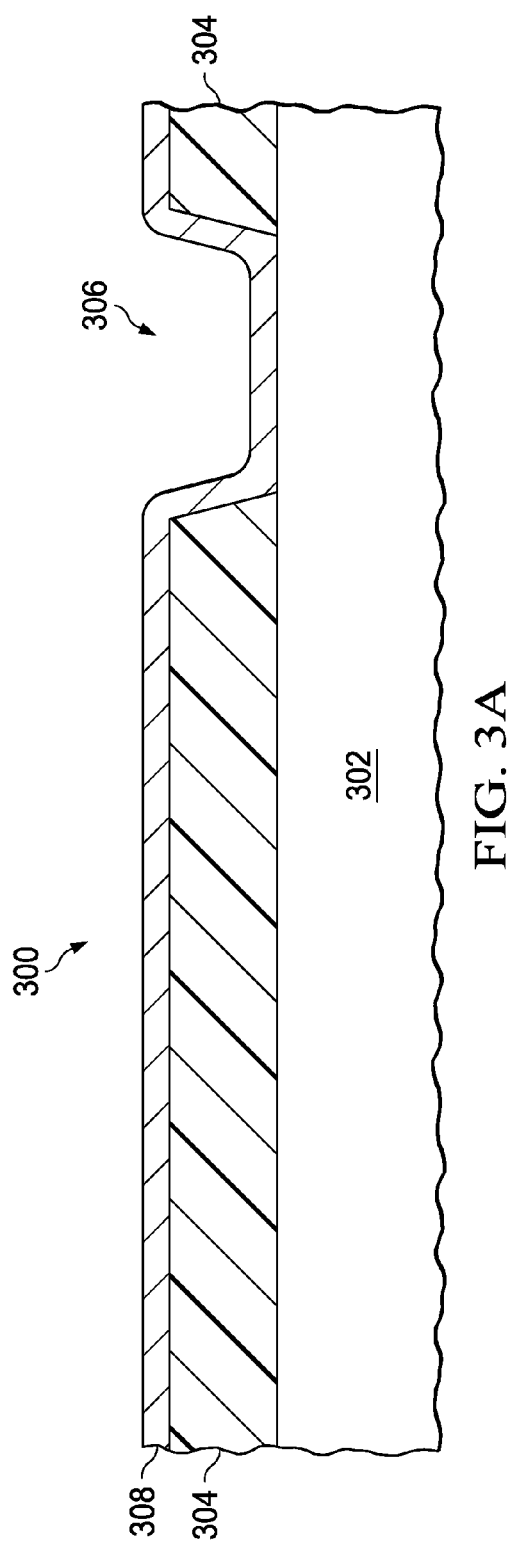
FIG. 3A through FIG. 3E are cross sections of a further exemplary MEMS device containing a released metal structure, depicted in successive stages of fabrication.

FIG. 3A through FIG. 3E are cross sections of a further exemplary MEMS device containing a released metal structure, depicted in successive stages of fabrication. Referring to FIG. 3A, the MEMS device 300 is formed on a substrate 302, for example, as described in reference to FIG. 1A. A sacrificial layer 304 is formed over the substrate 302. The sacrificial layer 304 may optionally be patterned so that a via hole 306 is formed through the sacrificial layer 304. The sacrificial layer 304 may include materials and be patterned as described in reference to FIG. 1A.

A first metal layer 308 of the released metal structure is formed over the sacrificial layer 304. The first metal layer 308 may include aluminum, titanium, tungsten, and/or other metals. In the instant example, a thickness of the first metal layer 308 is such that substantially all of the first metal layer 308 will be converted to metal oxide during subsequent exposure to a first oxidizing ambient and exposure to an oxidizing ambient of a release process which removes the sacrificial layer 304. The thickness of the first metal layer 308 may therefore be, for example, 2 nanometers to 10 nanometers, depending on the metals in the first metal layer 308. The first metal layer 308 may extend conformally into the via hole 306 if present.

Figure 3B:
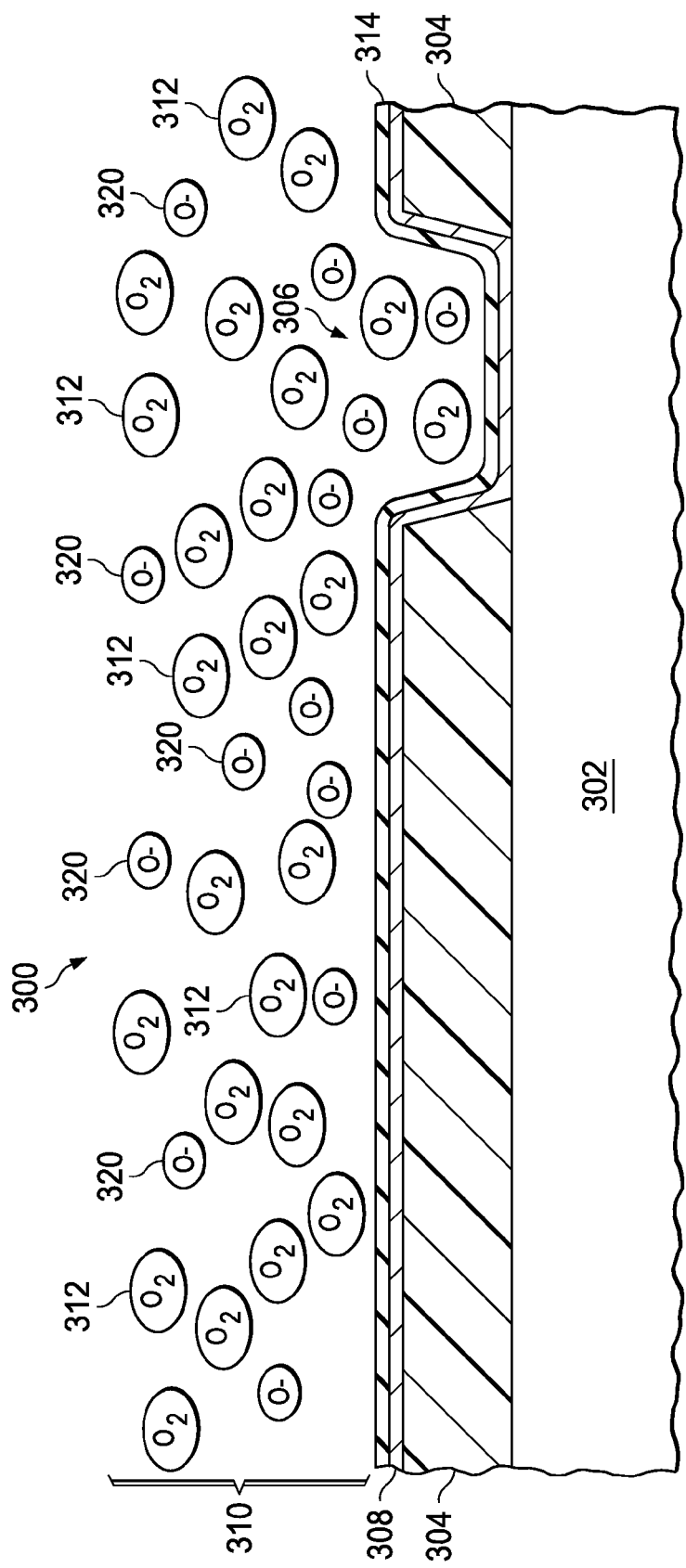

Referring to FIG. 3B, the first metal layer 308 is exposed to a first oxidizing ambient 310. The first oxidizing ambient 310 may be for example, as described in reference to FIG. 1B and FIG. 2B. An oxidizing species of the first oxidizing ambient 310 may include, for example, oxygen molecules 312 and oxygen radicals 320, as depicted schematically in FIG. 3B, or may include oxygen ions or ozone. As described in reference to FIG. 1B, the first metal layer 308 may be exposed to the first oxidizing ambient 310 by removing the MEMS device 300 from a process tool in which the first metal layer 308 was formed, or the first oxidizing ambient 310 may be introduced into the process tool after the first metal layer 308 is formed.

Exposure to the first oxidizing ambient 310 forms a first native oxide layer 314 at a top surface of the first metal layer 308, the top surface being the surface of the first metal layer 308 exposed to the first oxidizing ambient 310, regardless of the orientation of the MEMS device 300 during exposure to the first oxidizing ambient 310. The first native oxide layer 314 may be, for example, 1 nanometer to 10 nanometers thick, depending on a composition of the first metal layer 308. In one version of the instant example, the first metal layer 308 is exposed to the first oxidizing ambient 310 for a sufficient time so that formation of the first native oxide layer 314 is substantially self-limiting.

Figure 3C:
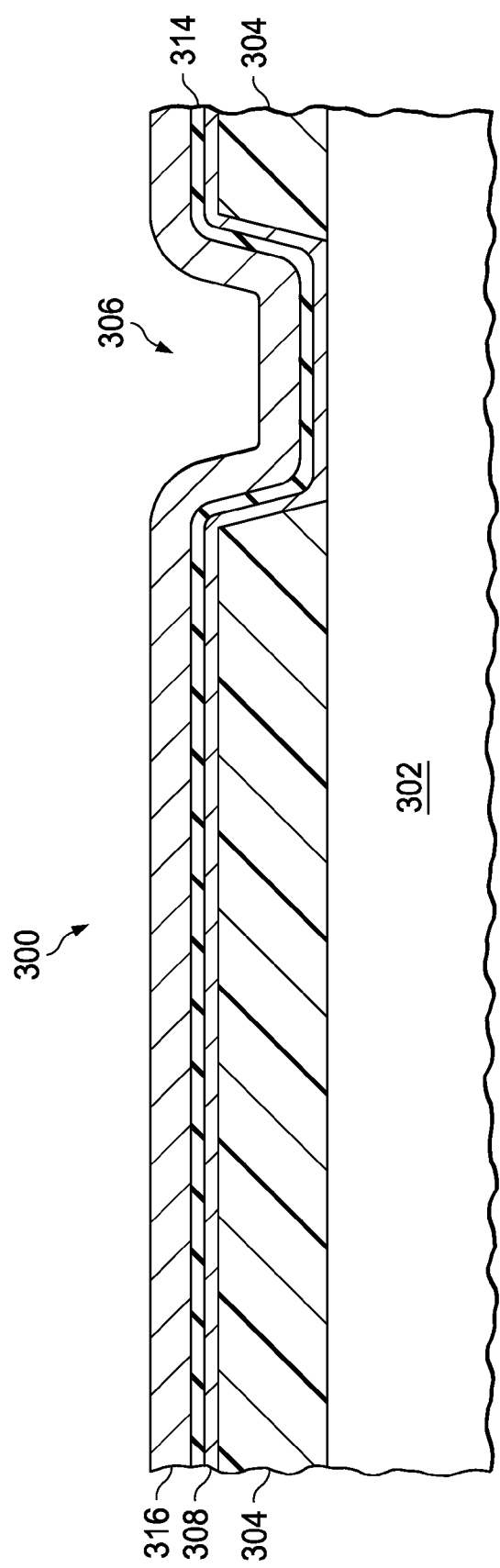

Referring to FIG. 3C, a second metal layer 316 is formed over the first native oxide layer 314. In the instant example, the second metal layer 316 is at least 20 nanometers thick. In one version of the instant example, the second metal level 316 may have a same composition as the first metal level 308. In another version, the second metal level 316 may have a different composition from the first metal level 308. The second metal layer 316 may extend conformally into the via hole 306 if present.

Figure 3D:
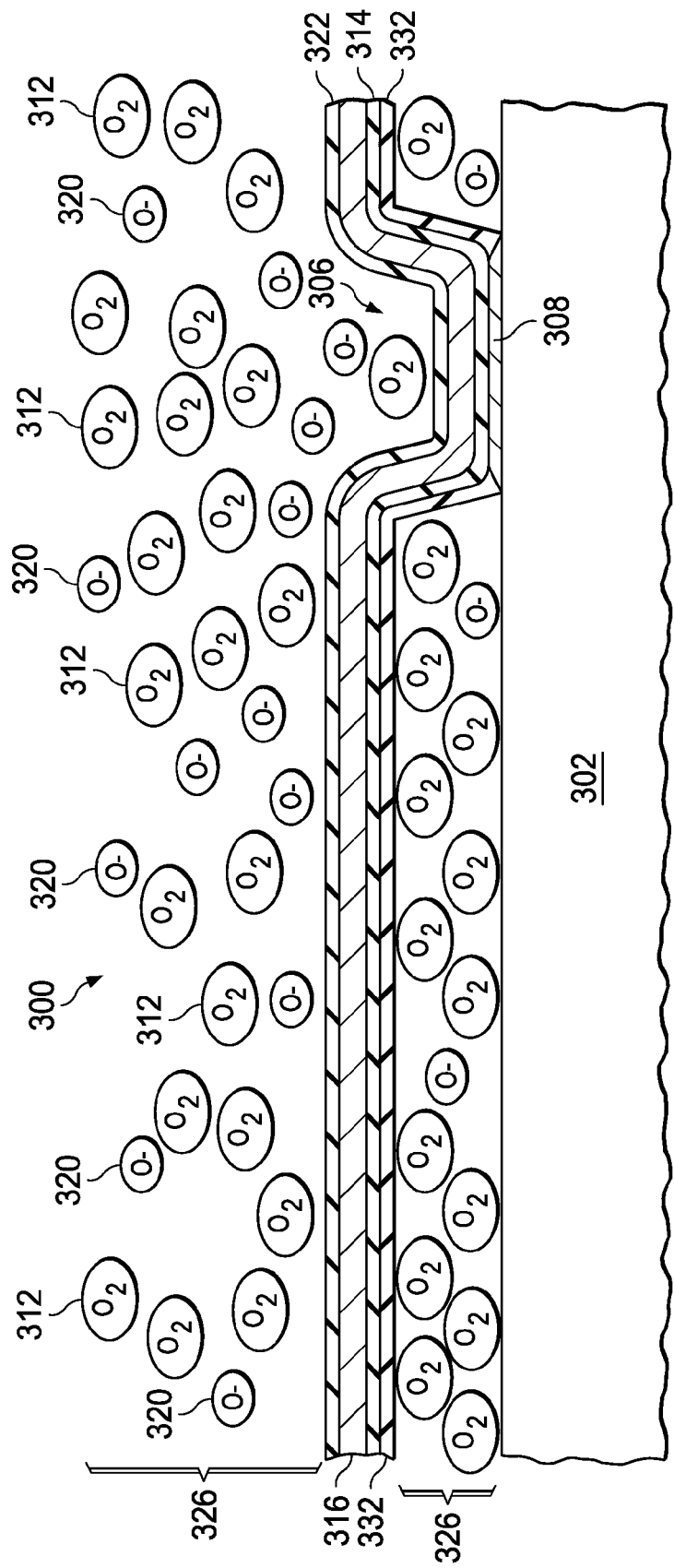

Referring to FIG. 3D, a release process is performed on the MEMS device 300 which removes the sacrificial layer 304 of FIG. 3C. The release process may include oxygen molecules 312 and oxygen radicals 320 and may be performed as described in reference to FIG. 1F. In the instant example, the release process oxidizes the remaining first metal layer 308 of FIG. 3C to form a second native oxide layer 332 which contacts a bottom surface of the first native oxide layer 314. A portion of the first metal layer 308 may remain substantially unoxidized at a bottom of the via hole 306 if present. The release process may possibly oxidize a top surface of the second metal layer 316 to form a third native oxide layer 322.

Figure 3E:
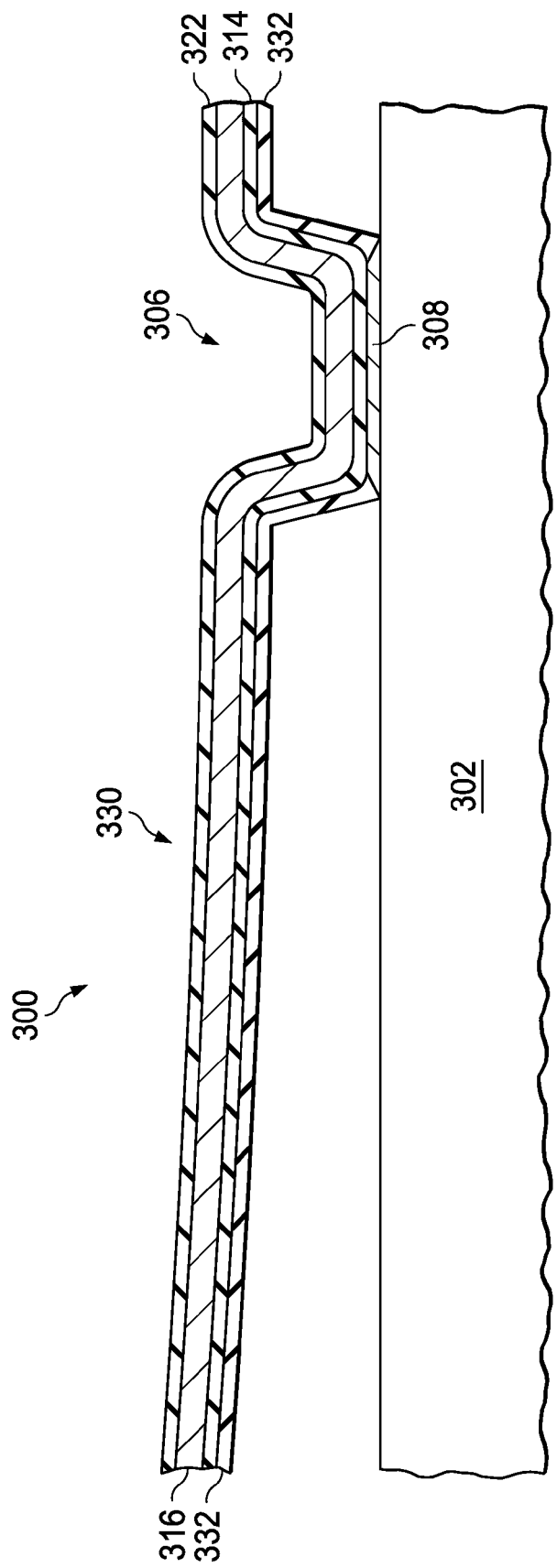

FIG. 3E depicts the MEMS device 300 after the release process is completed. The first metal layer 308, the first native oxide layer 314, the second native oxide layer 332 the second metal layer 316 and the third native oxide layer 322 if present provide the released metal structure 330 of the MEMS device 300. A portion of the released metal structure 330 is free of any direct contact with solid elements of the MEMS device 300. The second native oxide layer 332 is free of direct contact with any metal layer in the portion of the released metal structure 330 which is free of any contact with solid elements of the MEMS device 300. In the instant example, the portion of the released metal structure 330 which is free of any contact with solid elements of the MEMS device 300 has a desired concave shape, which is provided by a greater magnitude of compressive stress in the first native oxide layer 314 and the second native oxide layer 332, than a stress in the second metal layer 316 and the third native oxide layer 322 if present. The concave shape of the released metal structure 330 may provide an optical element or sensor element of the MEMS device 300. The released metal structure 330 may be attached to the substrate 302 through the via hole 306 if present. If the via hole 306 is not present, the released metal structure 330 is attached to the substrate 302, possibly through other elements, not shown of the MEMS device 300.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic-mechanical systems (MEMS) device, comprising:
    a substrate;
    a released metal structure attached to said substrate, in which at least first and second portions of said released metal structure are free of any direct contact with solid elements of said MEMS device, and in which a third portion of said released metal structure has direct contact with said substrate in an area between the first and second portions, said released metal structure comprising:
        a first metal layer;
        a first native oxide layer of said first metal layer disposed at a top surface of said first metal layer; and
        a second metal layer disposed on said first native oxide layer.

2. The MEMS device of claim 1, in which said released metal structure further comprises:
    a second native oxide layer of said second metal layer disposed at a top surface of said second metal layer; and
    a third metal layer disposed on said second native oxide layer.

3. The MEMS device of claim 1, in which said second metal level has a same composition as said first metal level.

4. The MEMS device of claim 1, in which said second metal level has a different composition from said first metal level.

5. The MEMS device of claim 1, in which at least one of said first and second portions of said released metal structure which is free of any direct contact with solid elements of said MEMS device has a substantially flat shape.

6. The MEMS device of claim 1, in which at least one of said first and second portions of said released metal structure which is free of any direct contact with solid elements of said MEMS device has a substantially convex shape.

7. The MEMS device of claim 1, in which at least one of said first and second portions of said released metal structure which is free of any direct contact with solid elements of said MEMS device has a substantially concave shape.

8. The MEMS device of claim 1, in which said first metal layer includes a metal selected from the group consisting of aluminum and titanium aluminum alloy.

9. A MEMS device, comprising:
    a substrate;
    a released metal structure attached to said substrate, in which at least first and second portions of said released metal structure are free of any direct contact with solid elements of said MEMS device, and in which a third portion of said released metal structure has direct contact with said substrate in an area between the first and second portions, said released metal structure comprising:
        a metal layer;
        a first native oxide layer disposed in contact with said metal layer at exactly one of a top surface of said metal layer and a bottom surface of said metal layer; and
        a second native oxide layer disposed in contact with said first native oxide layer, said second native oxide layer being free of direct contact with any metal layer in said first and second portions of said released metal structure which are free of any direct contact with said solid elements of said MEMS device.

10. The MEMS device of claim 9, in which said first native oxide layer is disposed on a top surface of said metal layer.

11. The MEMS device of claim 9, in which at least one of said first and second portions of said released metal structure which is free of any direct contact with solid elements of said MEMS device has a substantially convex shape.

12. The MEMS device of claim 9, in which said first native oxide layer is disposed on a bottom surface of said metal layer.

13. The MEMS device of claim 12, in which at least one of said first and second portions of said released metal structure which is free of any direct contact with solid elements of said MEMS device has a substantially concave shape.

14. The MEMS device of claim 9, in which said metal layer includes a metal selected from the group consisting of aluminum and titanium aluminum alloy.

* * * * *